US012666904B2

(12) United States Patent
Kang et al.

(10) Patent No.: US 12,666,904 B2
(45) Date of Patent: Jun. 23, 2026

(54) SEMICONDUCTOR PROCESS DEVICE HAVING AN OPTICAL SYSTEM ON A WINDOW

(71) Applicant: SAMSUNG ELECTRONICS CO., LTD., Suwon-si (KR)

(72) Inventors: Chansoo Kang, Suwon-si (KR); Daewon Kang, Suwon-si (KR); Sangki Nam, Suwon-si (KR); Jungmo Yang, Suwon-si (KR); Changsoon Lim, Suwon-si (KR); Sungho Jang, Suwon-si (KR); Jonghun Pi, Suwon-si (KR); Youngil Kang, Suwon-si (KR); Yoonjae Kim, Suwon-si (KR); Ilwoo Kim, Suwon-si (KR); Jongmu Kim, Suwon-si (KR); Yongbeom Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 604 days.

(21) Appl. No.: 18/184,418

(22) Filed: Mar. 15, 2023

(65) Prior Publication Data

US 2024/0047247 A1 Feb. 8, 2024

(30) Foreign Application Priority Data

Aug. 2, 2022 (KR) ........................ 10-2022-0095874

(51) Int. Cl.
*H10P 72/00* (2026.01)
*H01J 37/32* (2006.01)

(52) U.S. Cl.
CPC .... *H10P 72/0604* (2026.01); *H01J 37/32944* (2013.01); *H01J 2237/221* (2013.01)

(58) Field of Classification Search
CPC ........... H01L 21/67253; H01L 21/6833; H01L 21/68771; H01J 37/32944;
(Continued)

(56) References Cited

U.S. PATENT DOCUMENTS 6,332,961 B1 12/2001 Johnson et al.
6,657,719 B1 * 12/2003 Benck ..................... G01J 3/443
216/60
(Continued)

FOREIGN PATENT DOCUMENTS

KR 101010928 B1 1/2011
KR 10-2018-0073700 A 7/2018
(Continued)

*Primary Examiner* — Eric J Yoon
(74) *Attorney, Agent, or Firm* — Wolf, Greenfield & Sacks, P.C.

(57) ABSTRACT

A semiconductor process device includes a chamber housing defining an internal region and a plurality of electrostatic chucks within the internal region. The chamber housing includes a window, and a light collection unit including a first optical system and a second optical system located at different positions on the window. A plurality of first optical pickup units are connected to the first optical system, and a plurality of second optical pickup units are connected to the second optical system. A sensor includes a plurality of photodetectors that are configured to convert a first optical signal transmitted by the plurality of first optical pickup units and a second optical signal transmitted by the plurality of second optical pickup units into electrical signals. A processor is configured to generate a spatial image of the internal region of the chamber housing using the electrical signals output by the plurality of photodetectors, and determine a location at which an arc occurs in the internal region of the chamber housing based on the spatial image.

20 Claims, 18 Drawing Sheets

(58) Field of Classification Search
  CPC .......... H01J 37/32972; H01J 37/32119; H01J
          37/244; H01J 37/32917; H05H 1/0025;
          G01J 1/42; G01J 3/443
  See application file for complete search history.

(56)                References Cited

U.S. PATENT DOCUMENTS

| | | | |
|---|---|---|---|
| 2006/0049831 | A1 | 3/2006 | Anwar et al. |
| 2009/0014409 | A1* | 1/2009 | Grimbergen .............. C23F 4/00 |
| | | | 216/60 |
| 2011/0090503 | A1 | 4/2011 | Lee et al. |
| 2012/0259562 | A1 | 10/2012 | Booth et al. |
| 2013/0016344 | A1 | 1/2013 | Bullock et al. |
| 2016/0268108 | A1 | 9/2016 | Daniels et al. |
| 2017/0068067 | A1* | 3/2017 | Chern ................... H04N 23/51 |
| 2017/0140905 | A1* | 5/2017 | Mihaylov ......... H01J 37/32917 |
| 2017/0314991 | A1 | 11/2017 | Meng et al. |
| 2018/0143141 | A1 | 5/2018 | Omstead et al. |
| 2018/0252650 | A1* | 9/2018 | Morvay ............ H01J 37/32422 |
| 2019/0237499 | A1* | 8/2019 | Roy ..................... H10F 39/802 |
| 2022/0037135 | A1 | 2/2022 | Kapoor et al. |
| 2024/0234112 | A1* | 7/2024 | Danek .............. H01L 21/67248 |

FOREIGN PATENT DOCUMENTS

| | | | |
|---|---|---|---|
| KR | 10-2020-0019258 | A | 2/2020 |
| KR | 20210117348 | A | 9/2021 |

* cited by examiner

420

421

Y

X

600

610

SEMICONDUCTOR PROCESS DEVICE HAVING AN OPTICAL SYSTEM ON A WINDOW

CROSS TO REFERENCE TO RELATED APPLICATION(S)

This application claims priority under 35 U.S.C. § 119 to Korean Patent Application No. 10-2022-0095874 filed on Aug. 2, 2022 in the Korean Intellectual Property Office, the disclosure of which is incorporated herein by reference in its entirety.

BACKGROUND

Example embodiments of the present disclosure relate to semiconductor process devices.

A semiconductor process device may be chamber-type device for performing various semiconductor processes on a substrate such as a wafer, and plasma may be formed in the chamber during the semiconductor process. Radicals and ions may form plasma by power supplied to the semiconductor process device, and semiconductor processes such as deposition and etching may be performed. While a semiconductor process is performed, an arc may be generated in plasma, and such an arc may damage a wafer or may deteriorate properties of a semiconductor device formed on the wafer. Accordingly, a method for accurately determining arc in a semiconductor process device while the semiconductor process is performed may be necessary.

SUMMARY

An example embodiment of the present disclosure is to provide, by generating a spatial image of an interior of a chamber by applying a tomography technique to an optical signal received by a plurality of optical pickup units through an optical system mounted on a window of a chamber housing, a semiconductor process device which may accurately determine whether an arc has occurred and also a position or location of the arc.

According to an example embodiment of the present disclosure, a semiconductor process device includes a chamber housing defining an internal region, and a plurality of electrostatic chucks within the internal region. The chamber housing includes at least one window, and a light collection unit including a first optical system and a second optical system are mounted on the at least one window. A plurality of first optical pickup units are connected to the first optical system, and a plurality of second optical pickup units are connected to the second optical system. A sensor includes a plurality of photodetectors configured to convert respective first optical signals transmitted by the plurality of first optical pickup units and respective second optical signals transmitted by the plurality of second optical pickup units into electrical signals. A processor is configured to generate a spatial image for the internal region of the chamber housing using the electrical signals output by the plurality of photodetectors, and determine a location at which an arc occurred in the internal region of the chamber housing based on the spatial image.

According to an example embodiment of the present disclosure, a semiconductor process device includes a chamber housing including a first window on a first surface of a first wall of the chamber housing and a second window on a second surface of a second wall of the chamber housing, wherein the first surface is transverse to the second surface.

A plurality of first optical pickup units are mounted on the first window and are configured to detect a first optical signal from an internal region of the chamber housing through the first window. A plurality of second optical pickup units are mounted on the second window and are configured to detect a second optical signal from the internal region of the chamber housing through the second window. A sensor includes a plurality of first photodetectors configured to output a first voltage signal in response to the first optical signal and a plurality of second photodetectors configured to output a second voltage signal in response to the second optical signal. A processor is configured to generate a spatial image of the internal region of the chamber housing using the first voltage signal and the second voltage signal.

According to an example embodiment of the present disclosure, a semiconductor process device includes a chamber housing including first and second walls, a first window on a surface of the first wall, wherein the first window provides optical access through the first wall into an internal region of the chamber housing, and a second window on a surface of the second wall, wherein the second window provides optical access through the second wall into the internal region of the chamber housing. A first optical system is mounted on the first window and includes a plurality of first optical pickup units configured to receive an optical signal from the internal region of the chamber housing through the first optical system. A second optical system is mounted on the second window and includes a plurality of second optical pickup units configured to receive an optical signal from the internal region of the chamber housing through the second optical system.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, embodiments of the present disclosure will be described as follows with reference to the accompanying drawings.

Figure 1:
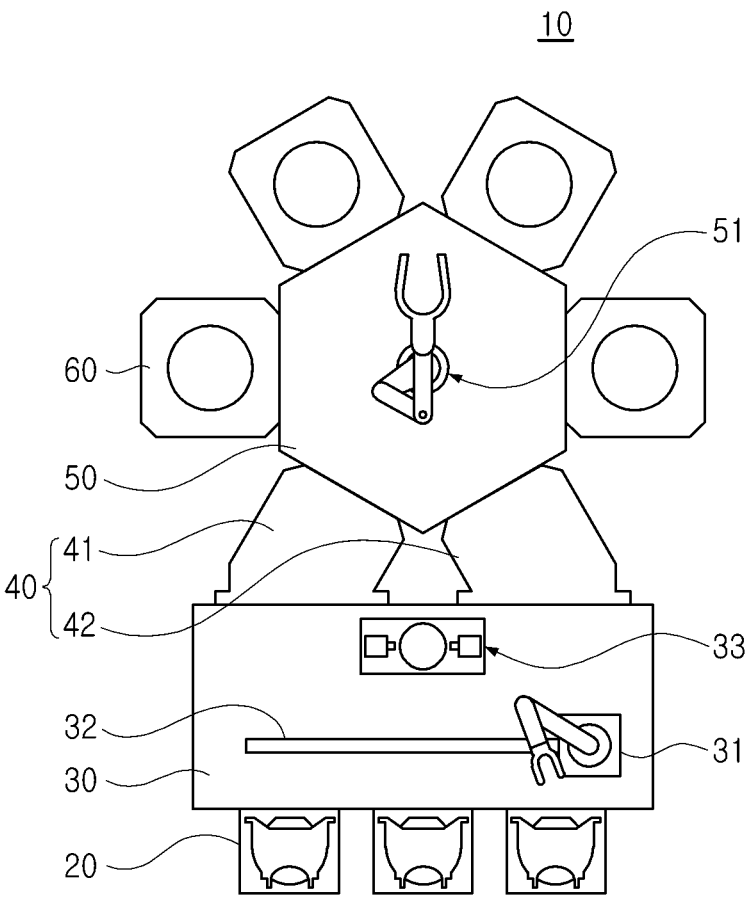
FIG. 1 is a diagram illustrating a system including a semiconductor process device according to an example embodiment of the present disclosure.

FIG. 1 is a diagram illustrating a system including a semiconductor process device according to an example embodiment.

Referring to FIG. 1, a semiconductor process system 10 according to an example embodiment may include a wafer transfer device 30, a load lock chamber 40, a transfer chamber 50 and a plurality of process chambers 60. For example, the wafer transfer device 30 may receive a wafer through a container such as a front open unified pod FOUP 20 within a line in which the semiconductor process system 10 is disposed. The wafer transfer device 30 may transfer the wafer received through the FOUP 20 to the load lock chamber 40, or may receive the wafer on which the semiconductor process is completed in the process chambers from the load lock chamber 40 and may be stored in the FOUP 20.

The wafer transfer device 30 may include a wafer transfer robot 31 having an arm for holding a wafer, a rail unit 32 for moving the wafer transfer robot 31, and an aligner 33 for aligning the wafer. Assuming that the wafer is transferred from the FOUP 20 to the load lock chamber 40, the wafer transfer robot 31 may take out the wafer accommodated in the FOUP and may place the wafer on the aligner 33. The aligner 33 may rotate the wafer and may align the wafer in one predetermined direction. When the aligner 33 completes the wafer alignment, the wafer transfer robot 31 may take the wafer out of the aligner 33 and may move the wafer to the load lock chamber 40.

The load lock chamber 40 may be connected to the wafer transfer device 30, and may include a loading chamber 41 in which wafers brought into the process chamber 60 may temporarily stay to perform the semiconductor process, and an unloading chamber 42 in which wafers having gone through the process and unloaded from the chamber 60 may temporarily stay. When the wafer aligned in the aligner 33 is loaded into the loading chamber 41, the internal region of the loading chamber 41 is decompressed such that external contaminants may be prevented from entering.

The load lock chamber 40 may be connected to the transfer chamber 50, and a plurality of process chambers 60 may be connected around the transfer chamber 50. A wafer transfer robot 51 for transferring wafers between the load lock chamber 40 and the plurality of process chambers 60 may be disposed in the transfer chamber 50. The wafer transfer robot 31 of the wafer transfer device 30 may be referred to as a first wafer transfer robot, and the wafer transfer robot 51 of the transfer chamber 50 may be referred to as a second wafer transfer robot.

Each of the plurality of process chambers 60 may perform a semiconductor process on a wafer. For example, the semiconductor process performed by the plurality of process chambers 60 may include a deposition process, an etching process, an exposure process, an annealing process, a polishing process, an ion implantation process, and the like. Depending on the semiconductor process to be performed, plasma may be formed in at least one of the plurality of process chambers 60 to perform the semiconductor process.

For example, while a semiconductor process is performed in a state in which plasma is formed, an arc may be generated in the process chamber 60. An arc may be an abnormal arc unintentionally generated. When an arc occurs during a semiconductor process, damage to a semiconductor substrate such as a wafer may occur, or properties of a semiconductor device formed by the semiconductor process may deviate from a desired range. Accordingly, a function for determining whether an arc has occurred may be implemented in the process chamber 60.

Recently, a multi-station process chamber 60 in which a plurality of wafers may be inserted into a process chamber 60, the plurality of wafers may be placed on a plurality of electrostatic chucks in the process chamber 60, and a semiconductor process is simultaneously performed has been suggested. In the multi-station process chamber 60, it may be important to determine the position of an arc along with determining whether an arc has occurred. For example, when the semiconductor process for the first wafer and the second wafer is simultaneously performed in the process chamber 60, which of the first wafer and the second wafer is affected depending on the position in which an arc occurs may vary.

Whether an arc has occurred may be determined by detecting a voltage and/or current of bias power supplied to the process chamber 60, but it may be difficult to determine the position in which an arc has occurred by this method. In an example embodiment, optical pickup units for receiving an optical signal from the internal region of the process chamber through a window included in the process chamber 60 may be mounted on the process chamber 60. The optical signal received by the optical pickup units may be converted into an electrical signal by the photodetectors, and the processor may determine whether an arc has occurred and a position in which an arc has occurred using the electrical signal. Accordingly, the effect of an arc generated in the process chamber 60 on the wafer may be analyzed in detail, and yield of the semiconductor process may improve.

Figure 2:
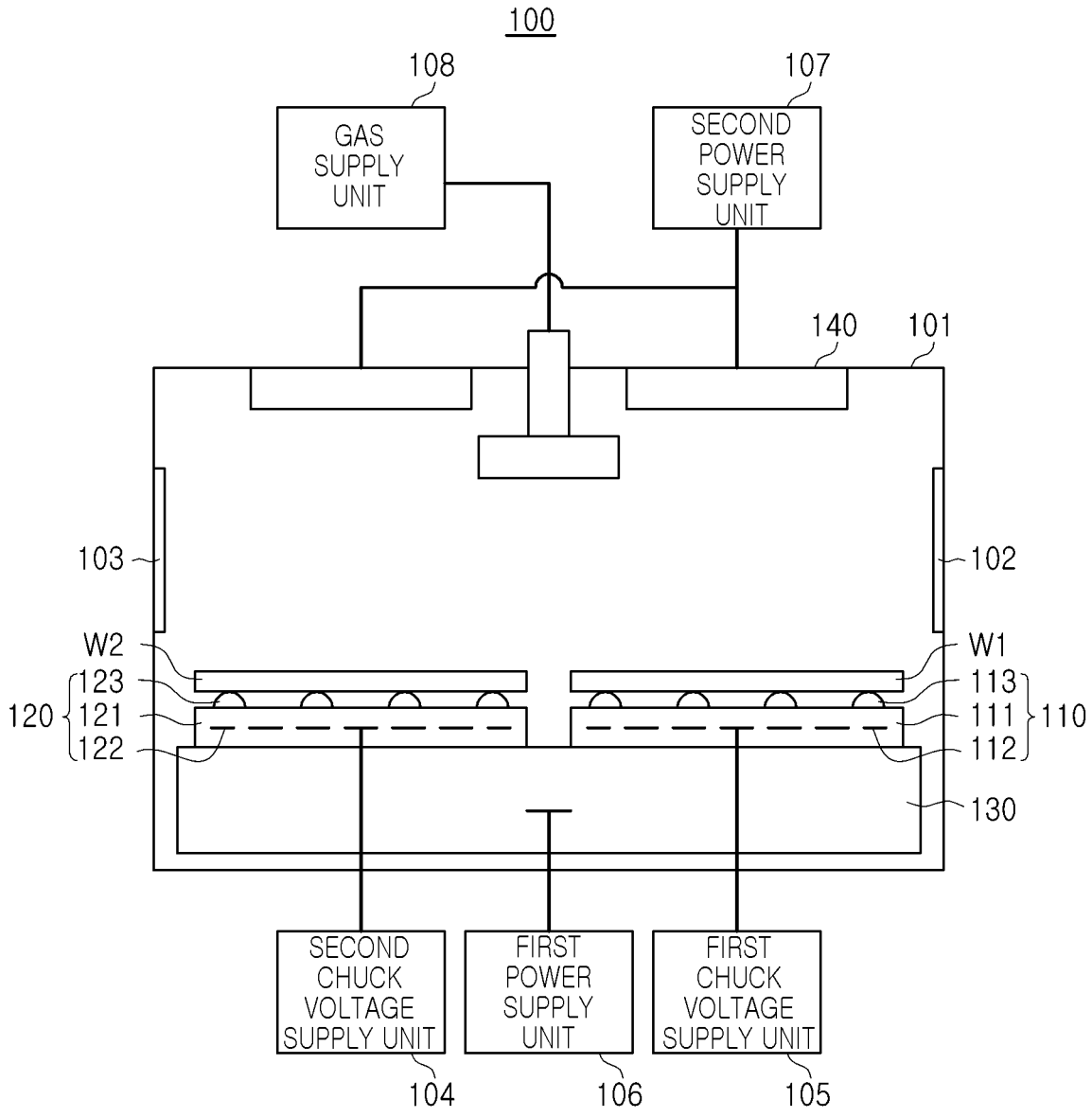
FIG. 2 is a diagram illustrating a semiconductor process device according to an example embodiment of the present disclosure.

FIG. 2 is a diagram illustrating a semiconductor process device according to an example embodiment.

Referring to FIG. 2, the semiconductor process device 100 according to an example embodiment may be configured as a device for performing a semiconductor process using plasma. The semiconductor process device 100 may include a chamber housing 101, electrostatic chucks 110 and 120, chuck voltage supply units 104 and 105, power supply units 106 and 107, and a gas supply unit 108.

The electrostatic chucks 110 and 120, the first bias electrode 130, the second bias electrode 140, and the gas flow path 150 may be installed in the internal space in the chamber housing 101. A semiconductor substrate on which a semiconductor process is to be performed, such as, for example, wafers W1 and W2 may be seated on the electrostatic chucks 110 and 120. In the semiconductor process device 100 according to the example embodiment illustrated in FIG. 2, the first electrostatic chuck 110 and the second electrostatic chuck 120 may be disposed in a chamber housing 101.

The first electrostatic chuck 110 may include an electrostatic chuck body 111, a chuck electrode 112 in the electrostatic chuck body 111, and a protrusion 113. The second electrostatic chuck 120 may also include an electrostatic chuck body 121, a chuck electrode 122, and a protrusion 123. In each of the first electrostatic chuck 110 and the second electrostatic chuck 120, the first wafer W1 and the second wafer W2 may be seated on the protrusions 113 and

123, and a space between the protrusions 113 and 123 may be filled with helium gas for cooling the wafers W1 and W2.

In an example embodiment, the first wafer W1 may be fixed to the electrostatic chuck 110 by cooling force generated from a voltage supplied by the first chuck voltage supply unit 104 to the chuck electrode 122 of the first electrostatic chuck 110, and similarly, the second wafer W2 may be fixed to the second electrostatic chuck 120 by a voltage supplied from the second chuck voltage supply unit 105 to the second electrostatic chuck 120. For example, the chuck voltage supply units 104 and 105 may output a constant voltage having a level of several hundred to several thousand volts.

To perform the semiconductor process, the gas supply unit 108 may flow a reaction gas into the chamber housing 101 through a gas flow path 150. The first power supply unit 106 may supply first RF power to the first bias electrode 130 disposed below the electrostatic chucks 110 and 120, and the second power supply unit 107 may supply second RF power to the second bias electrode 140 disposed above the electrostatic chucks 110 and 120. Each of the first power supply unit 106 and the second power supply unit 107 may include an RF power source for supplying bias power and a matching network.

Plasma 160 including ions, radicals, and electrons of a reactive gas by the first RF power and the second RF power may be generated on the wafers W1 and W2, and the reaction gas may be activated by the plasma 160 such that reactivity may increase. For example, when the semiconductor process device 100 is an etching device, ions, radicals, and electrons of the reaction gas may be accelerated to the wafers W1 and W2 by the first RF power supplied by the first power supply unit 106 to the first bias electrode 130. At least a portion of the layers or structures formed on the wafers W1 and W2 or the wafers W1 and W2 may be dry-etched by ions, radicals, and electrons of the reactive gas.

While the plasma 160 is formed and the semiconductor process is performed, an arc may be generated in the chamber housing 101. When an arc occurs, ions, radicals, and electrons of the reactive gas may be controlled in an undesirable direction, such that the wafers W1 and W2 may be damaged, or properties of the semiconductor device to be formed on the wafers W1 and W2 through the semiconductor process may become different.

In an example embodiment, whether an arc occurs during a semiconductor process, and whether an arc occurs in a position affecting which wafer among the first wafer W1 and the second wafer W2 may be determined. For example, when an arc is generated during a semiconductor process, light may be observed due to an arc. Light due to an arc may be observed through the windows 102 and 103 provided in the chamber housing 101, but it may be inefficient to continuously observe the internal region of the chamber housing 101 through the windows 102 and 103 to determine whether an arc has occurred and the position of an arc.

In an example embodiment, an optical system and optical pickup units may be mounted on at least one of the windows 102 and 103, and the optical pickup units may be connected to photodetectors. When an arc occurs in the chamber housing 101, the optical pickup units may receive an optical signal generated by an arc and may transmit the signal to the photodetectors. Each of the photodetectors may convert an optical signal into an electrical signal. For example, the electrical signal may be a voltage signal.

A processor connected to the photodetectors may determine whether an arc has occurred with reference to a level of the electrical signal. When it is determined that an arc has occurred in the chamber housing 101 according to the level of the electrical signal, the processor may generate a spatial image of the internal region of the chamber housing 101 using raw data obtained by digitally converting the electrical signals. Accordingly, the processor may accurately determine whether an arc has occurred, as well as the position in which an arc has occurred, and by controlling the semiconductor process based on the determination, yield of the semiconductor process may improve.

Figure 3:
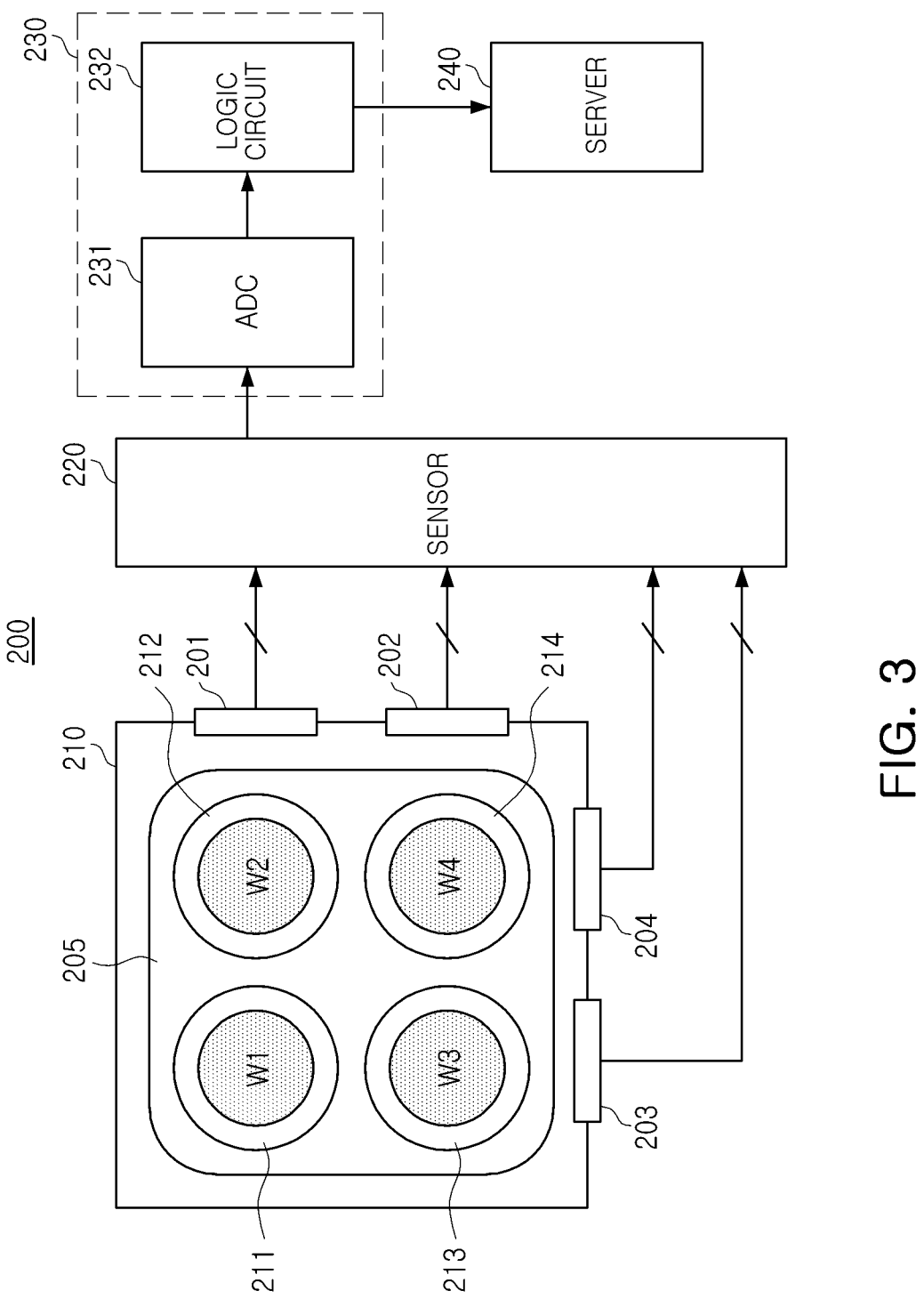
FIGS. 3 and 4 are diagrams illustrating a semiconductor process device according to an example embodiment of the present disclosure.
Figure 4:
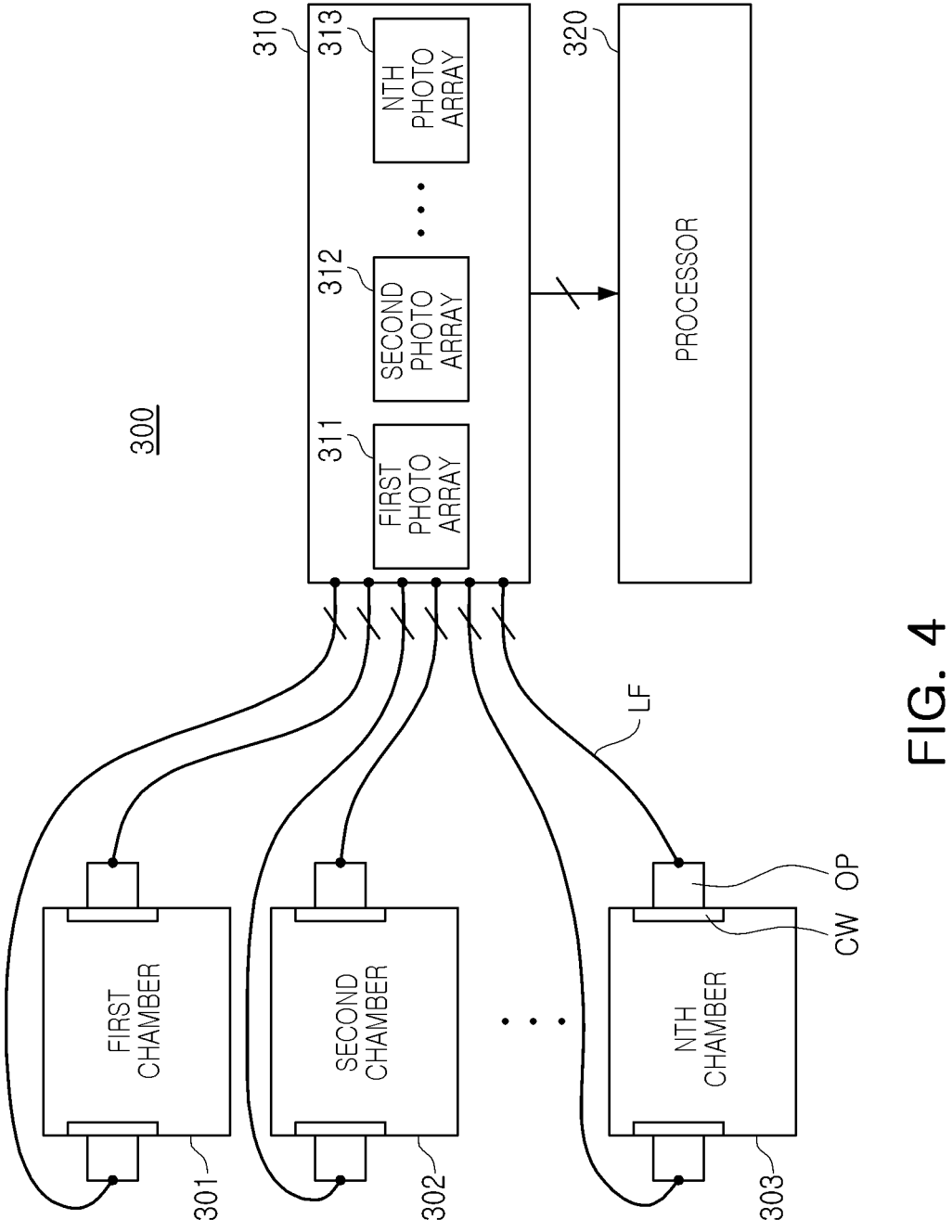

FIGS. 3 and 4 are diagrams illustrating a semiconductor process device according to an example embodiment.

Referring to FIG. 3, the semiconductor process device 200 according to an example embodiment may include a chamber 210, a sensor 220, a processor 230, and a server 240. The chamber 210 may include a plurality of windows 201-204 and a plurality of electrostatic chucks 211-214. Wafers W1-W4, which are targets of a semiconductor process, may be seated on the plurality of electrostatic chucks 211-214, respectively, and plasma 205 may be formed on the plurality of electrostatic chucks 211-214 while the semiconductor process is performed.

The sensor 220 may receive an optical signal from the internal region of the chamber 210 through the plurality of windows 201-204. For example, an optical system for collecting an optical signal in the chamber 210 may be installed in each of the plurality of windows 201-204. The optical system may include a plurality of lenses and may be configured to have a predetermined aperture value. The optical system may be shared by a plurality of optical pickup units, and each of the plurality of optical pickup units may be implemented as an optical guide. The plurality of optical pickup units may be connected to a plurality of photodetectors included in the sensor 220 through a plurality of optical fibers. For example, the plurality of photodetectors in the sensor 220 may be disposed in an array form.

The plurality of photodetectors included in the sensor 220 may convert an optical signal into an electrical signal and may output the converted optical signal to the processor 230. For example, the electrical signal output by the plurality of photodetectors may be a voltage signal, and the analog-to-digital converter (ADC) 231 of the processor 230 may convert the electrical signal into raw data which is a digital signal. The logic circuit 232 may determine whether an arc has occurred in the chamber 210 and the position of an arc using the raw data output by the analog-to-digital converter 231.

As an example, the logic circuit 232 may obtain a spatial image of the internal region of the chamber 210 by applying a tomography technique. An optical system mounted on the plurality of windows 201-204 and a plurality of optical pickup units may be installed to receive an optical signal from a space in which the plasma 205 is formed in the chamber 210. The logic circuit 232 may generate a spatial image of a space in which the plasma 205 is formed by applying a tomography technique to raw data corresponding to the optical signal received by the plurality of optical pickup units.

However, in order to reduce computational burden of the logic circuit 232, the logic circuit 232 may generate a spatial image only when it is determined that an arc has occurred in the plasma 205. The logic circuit 232 may first determine whether an arc has occurred using the raw data or the electrical signal output by the sensor 220. For example, the logic circuit 232 may determine whether an arc has occurred by comparing the voltage level of the electrical signal with a predetermined reference level or comparing a level change of the electrical signal with a predetermined reference range.

When it is determined that an arc has occurred, the logic circuit 232 may generate a spatial image using the raw data, and may determine a position in which an arc has occurred based on the spatial image. For example, when an arc is generated in the plasma 205, an extremely bright arc light signal may be instantaneously generated in the space in which an arc is generated. Accordingly, a portion of the plurality of optical pickup units mounted on the plurality of windows 201-204 may sense an arc light signal and may transmit an optical signal which is significantly different from other optical pickup units to the sensor 220. In the spatial image formed by the processor 230, the position in which an arc light signal is generated may be displayed, and the position in which an arc has occurred in the chamber 210 may be determined together with whether an arc has occurred. Accordingly, a wafer greatly affected by an arc from among the plurality of wafers W1-W4 may be determined, and follow-up measures may be applied accordingly.

The time point at which an arc occurred and the spatial image generated at the time point may be stored in a server 240. The server 240 may store the time point at which an arc has been generated and the position in which the arc has been generated together with control parameters input to control the chamber 210 at the corresponding time point. The data stored in the server 240 may be used for controlling the chamber 210 to reduce an arc, or to control another chamber.

As described with reference to FIG. 3, in an example embodiment, whether an arc has occurred and the position of an arc may be determined by collecting optical signals in the chamber 210, instead of using the method of determining an arc by detecting a voltage, current, and power of the RF power supplied to the bias electrodes in the chamber 210. Accordingly, as compared to the method of determining an arc by detecting voltage, current, and power changes of RF power, an arc with a small intensity may be sensed, thereby improving precision of an arc sensing operation.

Referring to FIG. 4, a semiconductor process system 300 according to an example embodiment may include a plurality of chambers 301-303, a sensor 310, and a processor 320. The plurality of chambers 301-303 may be disposed in a process line, and the same or different semiconductor processes may be performed in the plurality of chambers 301-303.

At least one window CW may be provided in each of the plurality of chambers 301-303, and a plurality of optical pickup units OP may be mounted on the window CW. As described above, the plurality of optical pickup units OP may be mounted on the window CW through an optical system, may collect optical signals in the internal spaces of the chambers 301-303 and may transmit the optical signals to the sensor 310.

The sensor 310 may include a plurality of photo arrays 311-313, and for example, the plurality of arrays 311-313 may correspond to a plurality of chambers 301-303. The sensor 310 and the processor 320 may be installed in positions different from those of the plurality of chambers 301-303 in a process line in which the semiconductor process system 300 is installed. For example, the plurality of photo arrays 311-313 of the sensor 310 may be connected to the plurality of chambers 301-303 through optical fibers LF.

The first photo array 311 may receive the optical signal of the internal space of the first chamber 301 through the optical fibers LF from the optical pickup units OP of the first chamber 301, and the second photo array 312 may receive an optical signal in the internal space of the second chamber 302 through the optical fibers LF from the optical pickup units OP of the second chamber 302. The Nth photo array 313 may receive an optical signal in the internal space of the Nth chamber 303 through the optical fibers LF from the optical pickup units OP of the Nth chamber 303.

Each of the plurality of photo arrays 311-313 may include a plurality of photodetectors, and for example, the number of the plurality of photodetectors in each of the plurality of photo arrays 311-313 may be the same as the number of the optical fibers LF connected to the plurality of photo arrays 311-313. The plurality of photodetectors may be disposed in an array form in each of the plurality of photo arrays 311-313, and may convert an optical signal received from the optical fibers LF into an electrical signal and may output the converted optical signal to the processor 320.

The processor 320 may determine whether an arc is generated in each of the plurality of chambers 301-303 using an electrical signal. For example, when the level of voltage of the electrical signal received from the first photo array 311 connected to the first chamber 301 is detected to be equal to or greater than a reference level, the processor 320 may determine that an arc has occurred in the first chamber 301. The processor 320 may convert the electrical signal output by the first photo array 311 into raw data and may form a spatial image of the internal region of the first chamber 301 using the data, thereby determining the position in which an arc has occurred in the first chamber 301.

Figure 5:
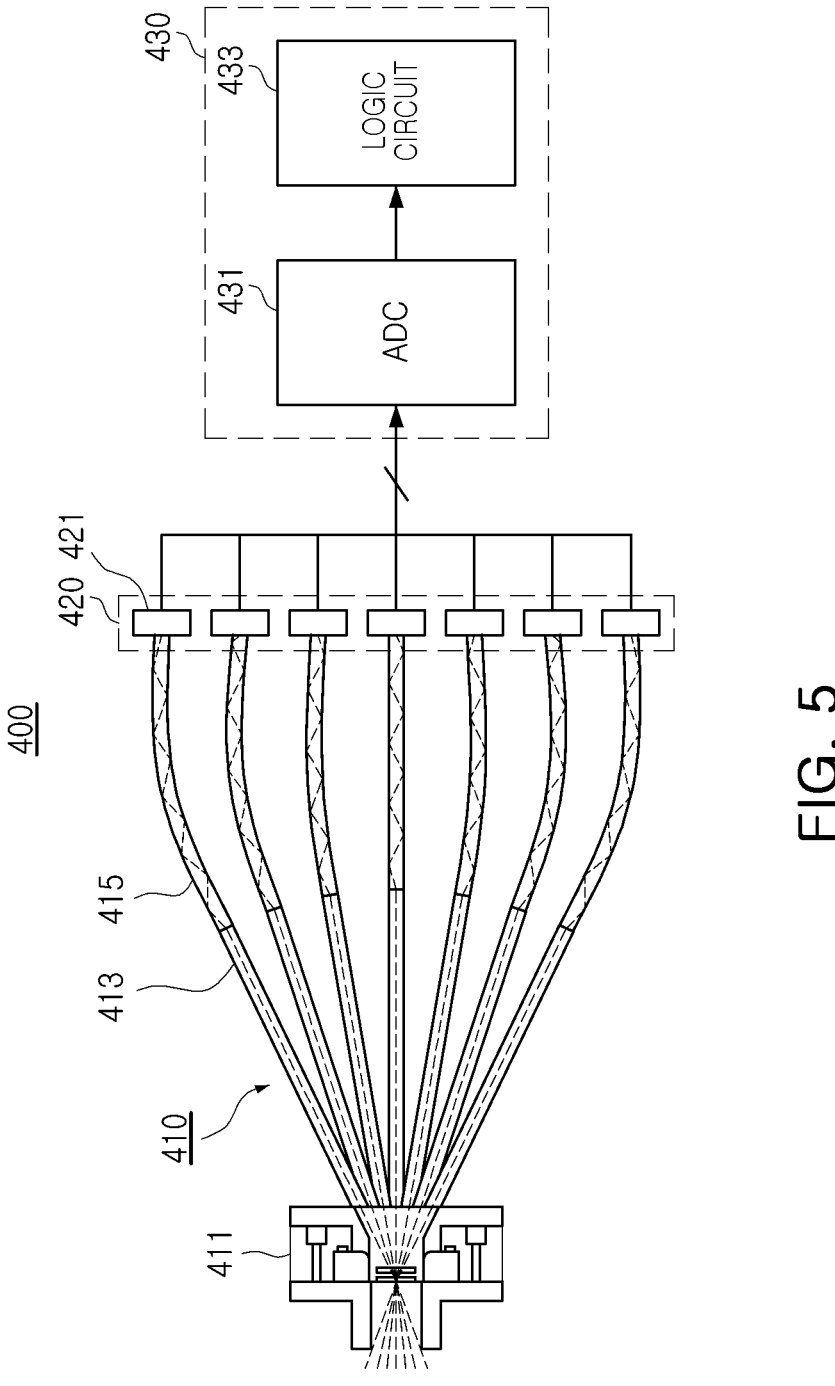
FIG. 5 is a diagram illustrating a semiconductor process device according to an example embodiment of the present disclosure.
Figure 6:
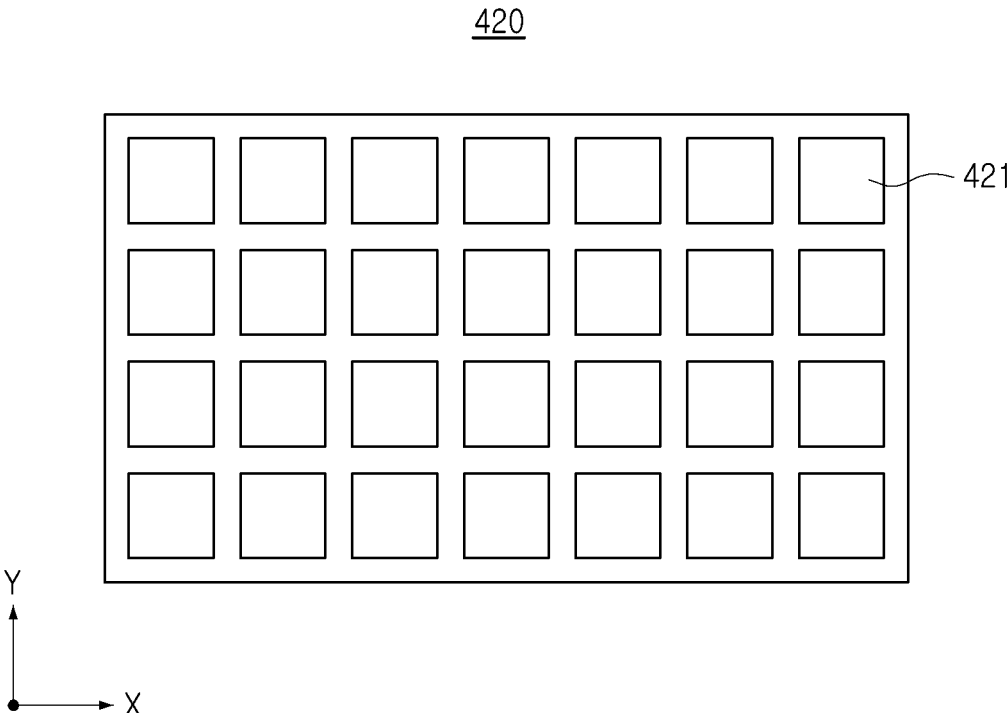
FIG. 6 is a diagram illustrating a photo-array included in the semiconductor process device illustrated in FIG. 5 according to an example embodiment of the present disclosure.

FIG. 5 is a diagram illustrating a semiconductor process device according to an example embodiment. FIG. 6 is a diagram illustrating a photo-array included in the semiconductor process device illustrated in FIG. 5 according to an example embodiment.

Referring first to FIG. 5, the semiconductor process device 400 according to an example embodiment may include a light collection unit 410, a sensor 420, and a processor 430. The light collection unit 410 may include an optical system 411 attached to a window of the chamber to collect an optical signal in the chamber in which the semiconductor process is performed, a plurality of optical pickup units 413 connected to the optical system 411, and optical fibers 415.

The optical system 411 may include an opening and a plurality of lenses to have a predetermined wide angle, and may be connected to a plurality of optical pickup units 413. Each of the plurality of optical pickup units 413 may function as a light guide, and may be connected to a plurality of photodetectors 421 included in the sensor 420 through a plurality of optical fibers 415. Referring to FIG. 5, an optical signal may be totally reflected by each of the plurality of optical fibers 415 and may be transmitted to each of the plurality of photodetectors 421.

As illustrated in FIG. 5, the plurality of optical fibers 415 may have flexible properties differently from the plurality of optical pickup units 413. Accordingly, differently from the optical system 411 and the plurality of optical pickup units 413 directly mounted on the window of the chamber, the sensor 420 may be disposed in a position different from that of the chamber in the process line, and may be connected to the plurality of optical pickup units 413 by the plurality of optical fibers 415.

Each of the plurality of photodetectors 421 may convert an optical signal received through the plurality of optical fibers 415 into a voltage signal and may provide the converted optical signal to the processor 430. The analog-to-digital converter 431 of the processor 430 may generate raw data by digitally converting the voltage signal, and the logic circuit 433 may generate a spatial image representing the space which the wide angle of the optical system 411 may cover.

Referring to FIG. 5, a plurality of optical pickup units 413 may be connected to an optical system 411 in common and may have different line of sight regions. A field of view of the optical system 411 and an area of a space covered by the optical system 411 may be determined by the sum of the line of sight regions of the plurality of optical pickup units 413. Accordingly, if necessary, the wide angle of the optical system 411 may be changed by changing the line of sight region of the plurality of optical pickup units 413, and the area of the space corresponding to the spatial image generated by the processor 430 may be adjusted. For example, by adjusting the length of each of the plurality of optical pickup units 413, the line of sight region of the plurality of optical pickup units 413 may be changed, and the field of view of the optical system 411 may be adjusted therefrom.

Thereafter, referring to FIG. 6, the sensor 420 according to an example embodiment may include a plurality of photodetectors 421 disposed in an array form along a plurality of rows corresponding to the X-axis direction and a plurality of columns corresponding to the Y-axis direction. The sensor 420 according to the example embodiment illustrated in FIG. 6 may be connected to a plurality of optical pickup units mounted in a plurality of chambers.

For example, the photodetectors 421 disposed along one of the plurality of rows may be connected to the light collection unit 410 in the aforementioned example embodiment described with reference to FIG. 5. The sensor 420 according to the example embodiment illustrated in FIG. 6 may be connected to a plurality of light collection units 410 mounted in different positions in a single chamber. For example, the sensor 420 may be connected to four light collection units 410 mounted in four different positions in one chamber, and the four light collection units 410 may be connected to the photodetectors 421 arranged along four rows.

Assuming that the first to fourth light collection units are provided in one chamber, the first optical pickup units of the first light collection unit may be connected to a plurality of first photodetectors disposed in a first row. The second optical pickup units of the second light collection unit may be connected to the plurality of second photodetectors disposed in the second row, and the third optical pickup units of the third light collection unit may be connected to the plurality of third photodetectors disposed in the third row. The fourth optical pickup units of the fourth light collection unit may be connected to a plurality of fourth photodetectors disposed in a fourth row. The number of the plurality of photodetectors 421 included in the sensor 420 and arrangement thereof may be varied according to the number of light collection units provided in the chamber.

In example embodiments, the sensor 420 according to the example embodiment illustrated in FIG. 6 may be connected to the plurality of chambers. For example, the sensor 420 may be connected to a plurality of optical pickup units mounted in four chambers, and the processor 430 may select a plurality of photodetectors 421 disposed in the sensor 420 by a row unit and may determine whether an arc is generated in each of the plurality of chambers and a position in which an arc is generated. In this case, a light collector may be provided in each of the four chambers.

Alternatively, two light collection units may be mounted in each of the two chambers, and the two chambers may be connected to the sensor 420. For example, the photodetectors in the first row and the second row may be connected to two light collection units provided in the first chamber, respectively, and the photodetectors in the third and fourth rows may be connected to the two light collection units provided in the second chamber, respectively. However, the method of connecting the sensor 420 and the chambers is not limited to the above-described example embodiments, and the relationship between the plurality of photodetectors 421 and the plurality of chambers may be varied.

FIGS. 7 to 10 are diagrams illustrating operations of a semiconductor process device according to an example embodiment.

Figure 7:
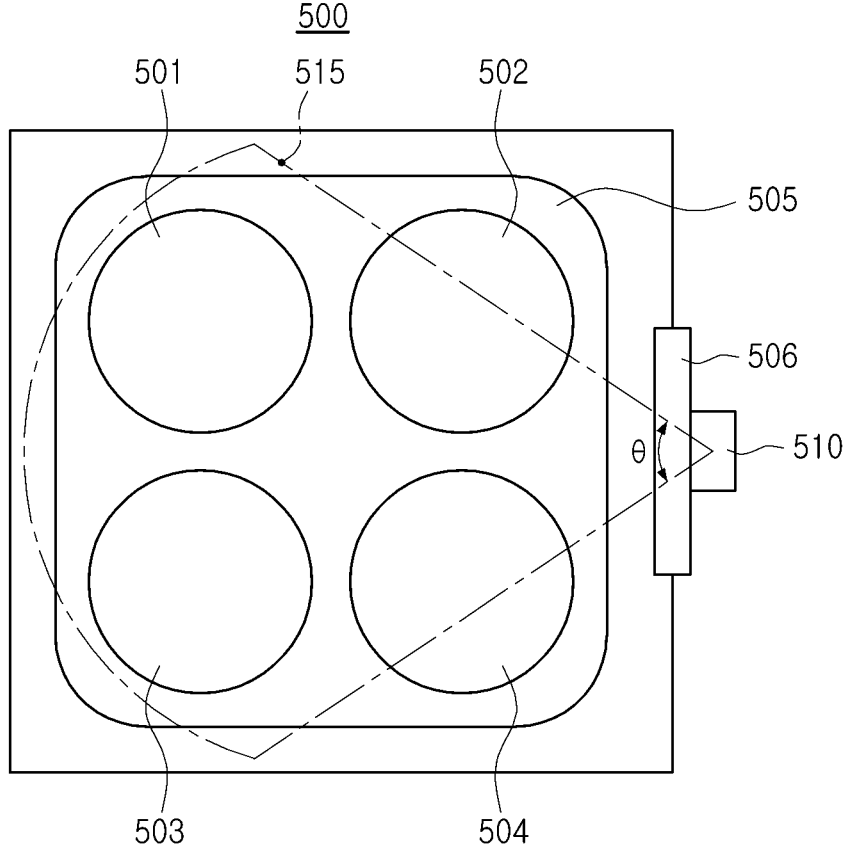
FIGS. 7, 8, 9, and 10 are diagrams illustrating operations of a semiconductor process device according to an example embodiment of the present disclosure.

Referring to FIG. 7, in a semiconductor process device 500 according to an example embodiment, a plurality of electrostatic chucks 501-504 may be disposed in a chamber, and a window 506 may be provided on one surface of a wall of the chamber housing and provides optical access through the wall into the internal region of the chamber housing. An optical system 510 having a predetermined wide angle θ may be mounted on the window 506. While the semiconductor process is performed, plasma 505 may be formed on the plurality of electrostatic chucks 501-504. As described above, the plasma 505 may be formed by RF power input to bias electrodes disposed in upper and lower portions of the plurality of electrostatic chucks 501-504 in the chamber.

While the plasma 505 is formed and the semiconductor process is performed, the optical signal of the cover region 515 may enter the optical system 510. The optical system 510 may be connected to a plurality of optical pickup units having line of sight regions in different directions, and accordingly, the optical signal of the cover region 515 may be dispersed to the plurality of optical pickup units according to the traveling direction.

The optical signal passing through the plurality of optical pickup units may be transmitted to the plurality of photodetectors through the plurality of optical fibers, and each of the plurality of photodetectors may output an electrical signal corresponding to the optical signal. The processor may determine whether an arc has occurred and a position in which an arc has occurred using the electrical signal.

In the example embodiment illustrated in FIG. 7, the optical system 510 may be mounted on only one window provided on one surface of a wall of the chamber. Accordingly, in order for the processor to generate a spatial image for determining an arc position using a tomography technique, a predetermined assumption on the distribution of the optical signal generated in the region in which the plasma 505 is formed may be necessary.

Figure 8:
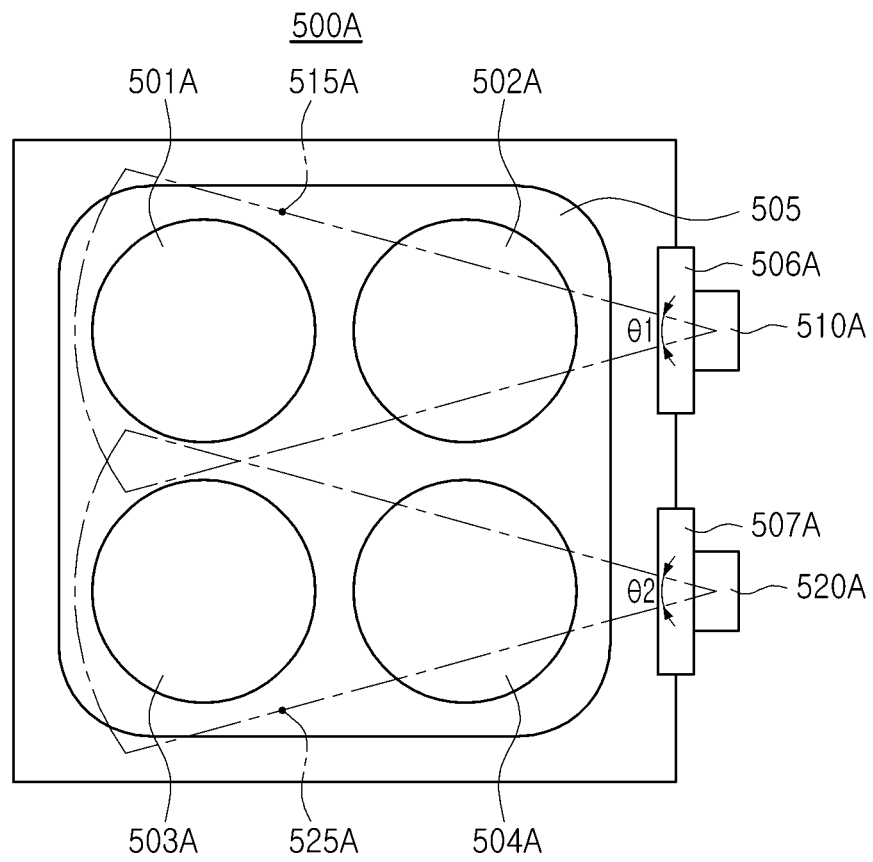

Thereafter, referring to FIG. 8, the semiconductor process device 500A according to an example embodiment may include a chamber in which a plurality of electrostatic chucks 501A-504A are disposed. A first window 506A and a second window 507A may be provided on one surface of a wall of the chamber housing. A first optical system 510A having a first wide angle θ1 may be mounted on the first window 506A, and a second optical system 520A having a second wide angle θ2 may be mounted on the second window 507A. While the semiconductor process is performed, plasma 505 may be formed on the plurality of electrostatic chucks 501A-504A. The relationship between the first wide angle θ1 and the second wide angle θ2 is not limited to any particular example, and the first wide angle θ1 and the second wide angle θ2 may be the same or different.

While the plasma 505 is formed and the semiconductor process is performed, the first optical signal of the first cover region 515A may enter the first optical system 510A, and the second optical signal of the second cover region 525A may enter the first optical system 510A. Each of the first optical system 510A and the second optical system 520A may be connected to a plurality of optical pickup units having line of sight regions in different directions. For example, the number of the plurality of first optical pickup units connected to the first optical system 510A may be the same as the number of the plurality of second optical pickup units connected to the second optical system 520A.

The first optical signal passing through the plurality of first optical pickup units may be transmitted to the plurality of first photodetectors through the plurality of first optical fibers, and the second optical signal passing through the plurality of second optical pickup units may be transmitted to the plurality of second photodetectors through the plurality of second optical fibers. The plurality of first photodetectors and the plurality of second photodetectors may output first and second electrical signals corresponding to the first optical signal and the second optical signal to the processor. The processor may determine whether an arc is generated in the plasma 505 and a position in which an arc is generated using the first electrical signal and the second electrical signal.

For example, when the first electrical signal output by at least one of the plurality of first photodetectors increases above a predetermined reference level, the processor may determine that an arc has occurred above the first electrostatic chuck 501A and/or the second electrostatic chuck 502A. The processor may configure a spatial image representing the first cover region 515A using the first electrical signal, and may determine a position in which an arc has occurred using the spatial image.

Figure 9:
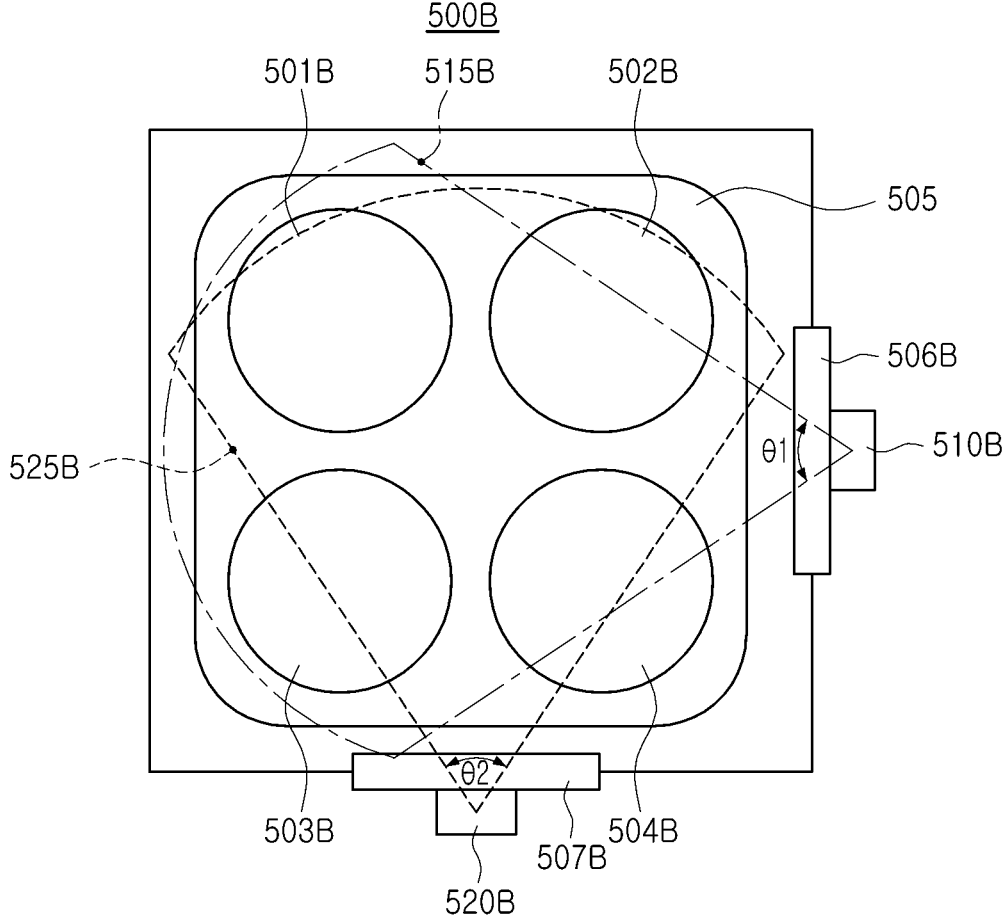

Thereafter, referring to FIG. 9, the semiconductor process device 500B according to an example embodiment may include a chamber in which a plurality of electrostatic chucks 501B-504B are disposed. A first window 506B may be provided on a first surface of a first wall of the chamber housing and provides optical access through the first wall into the internal region of the chamber housing, and a second window 507B may be provided on a second surface of a second wall different from the first wall, and provides optical access through the second wall into the internal region of the chamber housing. In the example embodiment in FIG. 9, the first surface and the second surface may extend in different directions and may intersect each other (i.e., are transverse to each other). A plasma 505 may be formed on the plurality of electrostatic chucks 501B-504B while a semiconductor process is performed.

A first optical system 510B having a first wide angle θ1 may be mounted on the first window 506B, and a second optical system 520B having a second wide angle θ2 may be mounted on the second window 507B. While the plasma 505 is formed and the semiconductor process is performed, the first optical signal of the first cover region 515B may enter the first optical system 510B, and the second optical signal of the second cover region 525B may enter the second optical system 520B. Each of the first optical system 510B and the second optical system 520B may be connected to a plurality of optical pickup units having line of sight regions in different directions.

The first optical signal passing through the plurality of first optical pickup units may be transmitted to the plurality of first photodetectors through the plurality of first optical fibers, and the second optical signal passing through the plurality of second optical pickup units may be transmitted to the plurality of second photodetectors through the plurality of second optical fibers. The plurality of first photodetectors and the plurality of second photodetectors may output first and second electrical signals corresponding to the first optical signal and the second optical signal to the processor. The processor may determine whether an arc is generated in the plasma 505 and a position in which an arc is generated using the first electrical signal and the second electrical signal.

In the example embodiment in FIG. 9, when an arc occurs in a specific position of the plasma 505, a level of the first electrical signal output by at least one of the plurality of first photodetectors, and the level of the second electrical signal output by at least one of the plurality of second photodetectors may be simultaneously detected as higher than a reference level. The processor may configure a spatial image representing the space in the chamber using the first electric signal and the second electric signal, and may determine a position in which an arc occurs using the spatial image. In the example embodiment illustrated in FIG. 9, the first optical system 510B and the second optical system 520B may be mounted on the first and second surfaces of respective first and second walls in different directions, respectively, and accordingly, without assumptions as in the aforementioned example embodiment described with reference to FIG. 7, the processor may generate the spatial image using the tomography technique.

Figure 10:
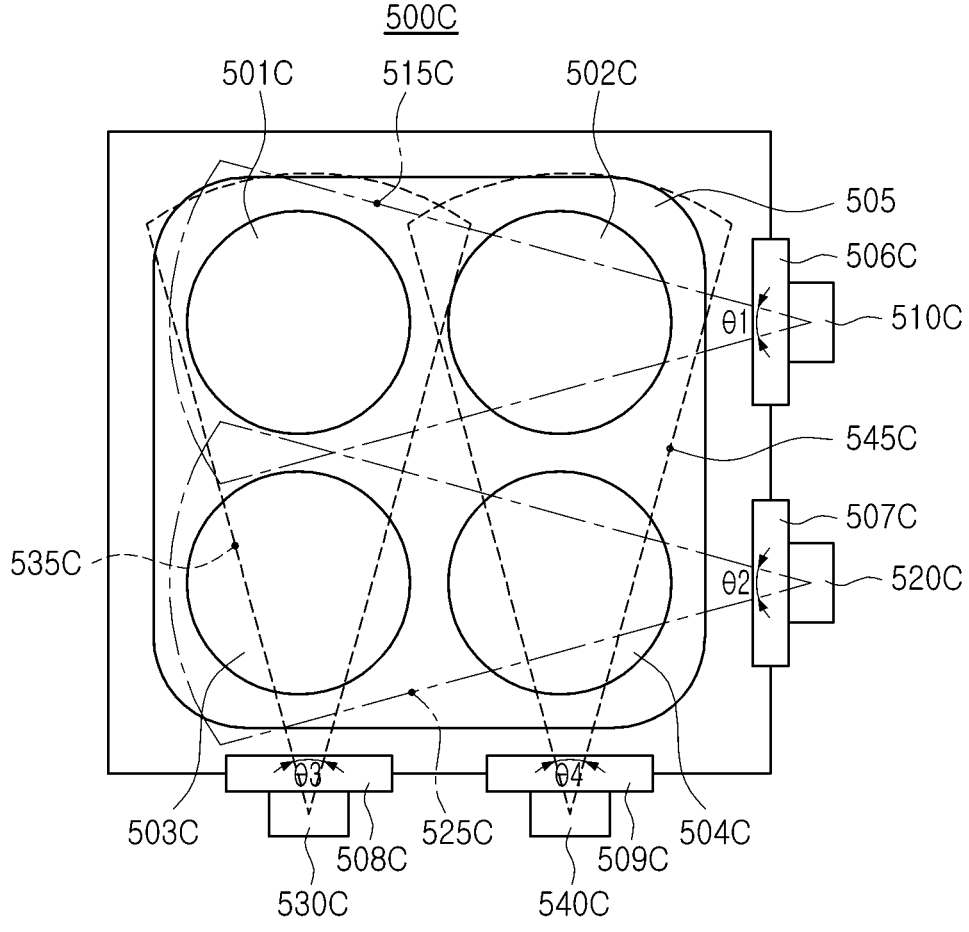

Referring to FIG. 10, in the semiconductor process device 500C according to an example embodiment, a plurality of electrostatic chucks 501C-504C may be disposed in a chamber, and a plurality of windows 506C-509C may be disposed in the chamber housing. In the example embodiment in FIG. 10, a first window 506C and a second window 507C may be provided on a first surface of a first wall of the chamber housing, and a third window 508C and a fourth window 509C may be provided on a second surface of a second wall in a direction different from the first surface. The plurality of windows 506C-509C provide optical access through the respective walls into the internal region of the chamber housing. While the semiconductor process is performed, plasma 505 may be formed on the plurality of electrostatic chucks 501C-504C.

A first optical system 510C having a first wide angle θ1 may be mounted on the first window 506C, and a second optical system 520C having a second wide angle θ2 may be mounted on the second window 507C. A third optical system 530C having a third wide angle θ3 may be mounted to the third window 508C, and a fourth optical system 540C having a fourth wide angle θ4 may be mounted to the fourth window 509C. The first optical signal of the first cover region 515C may enter the first optical system 510C, and the second optical signal of the second cover region 525C may enter the second optical system 520C. The first optical signal of the third cover region 535C may enter the third optical system 530C, and the second optical signal of the fourth cover region 545C may enter the fourth optical system 540C. The first to fourth optical systems 510C-540C may be connected to a plurality of optical pickup units having line of sight regions in different directions, respectively.

The first optical signal may be transmitted to the plurality of first photodetectors through the plurality of first optical fibers, and the second optical signal may be transmitted to the plurality of second photodetectors through the plurality of second optical fibers. The third optical signal may be transmitted to the plurality of third photodetectors through the plurality of third optical fibers, and the fourth optical signal may be transmitted to the plurality of fourth photodetectors through the plurality of fourth optical fibers. The plurality of first to fourth photodetectors may output first to fourth electrical signals corresponding to the first to fourth optical signals to the processor, and the processor may determine whether an arc has occurred and the position in which an arc occurred in the internal region of the chamber using the first to fourth electrical signals.

For example, when an arc occurs on the first electrostatic chuck 501C, the level of the first electrical signal output by at least one of the plurality of first photodetectors and the level of the third electrical signal output by at least one of the plurality of third photodetectors may be simultaneously detected as being equal to or higher than a reference level. When an arc occurs on the fourth electrostatic chuck 504C, the level of the second electrical signal output by at least one of the plurality of second photodetectors and the level of the fourth electrical signal output by at least one of the plurality of fourth photodetectors may be simultaneously detected above the reference level.

The processor may convert the first to fourth electrical signals into raw data in addition to the method of identifying the photodetectors in which the electrical signal above the reference level is detected as described above, and may form a spatial image representing the space in the chamber based on the data, thereby accurately determining the position of an arc. For example, when the level of the electrical signal output by at least one of the plurality of first to fourth photodetectors is detected to be equal to or higher than the reference level, the processor may convert the first to fourth electrical signals into raw data and may form a spatial image based on the first to fourth electrical signals.

Alternatively, in an example embodiment, a spatial image representing only a portion of the space in the chamber may be generated by converting only the electrical signals detected above the reference level into raw data. For example, when the level of the first electrical signal output by at least one of the plurality of first photodetectors and the fourth electrical signal output by at least one of the plurality of fourth photodetectors are simultaneously detected to be equal to or higher than the reference level, the processor may select the first electrical signal and the fourth electrical signal and may convert the signals into raw data, and may form a spatial image based on the selected first electrical signal and the fourth electrical signal. The spatial image may represent a space defined above the second electrostatic chuck 502C.

FIGS. 11A-11C, 12A-12C, 13A-13C, and 14A-14C are diagrams illustrating operations of a semiconductor process device according to an example embodiment.

FIGS. 11A to 11C, 12A to 12C, 13A to 13C, and 14A to 14C illustrate graphs indicating changes in first to third voltage signals output by first to third photodetectors connected to a chamber for a predetermined period of time. For example, the first to third photodetectors may share one optical system, may receive optical signals in different line of sight regions through one optical system, and may convert the signals into voltage signals.

Each of the first to third voltage signals output by the first to third photodetectors may increase and decrease within a predetermined normal range ΔNR while plasma is formed in the chamber and a semiconductor process is performed. In other words, a change in the level of the voltage signal belonging to the normal range ΔNR may not be recognized as an arc occurring in the chamber.

Figure 11A:
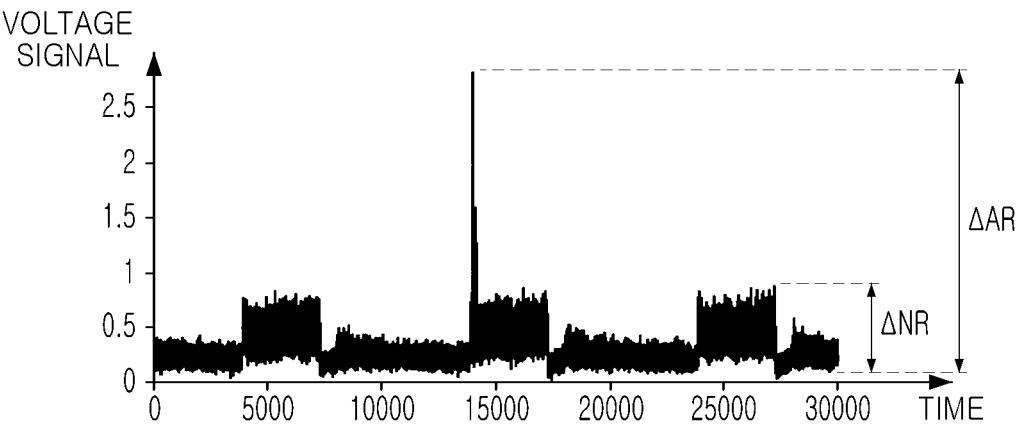
FIGS. 11A-11C, 12A-12C, 13A-13C, and 14A-14C are diagrams illustrating operations of a semiconductor process device according to an example embodiment of the present disclosure.
Figure 11B:
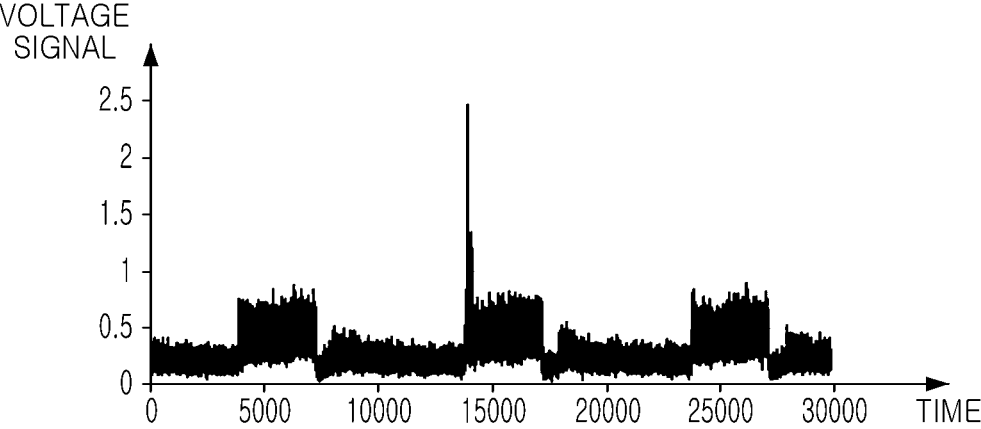
Figure 11C:
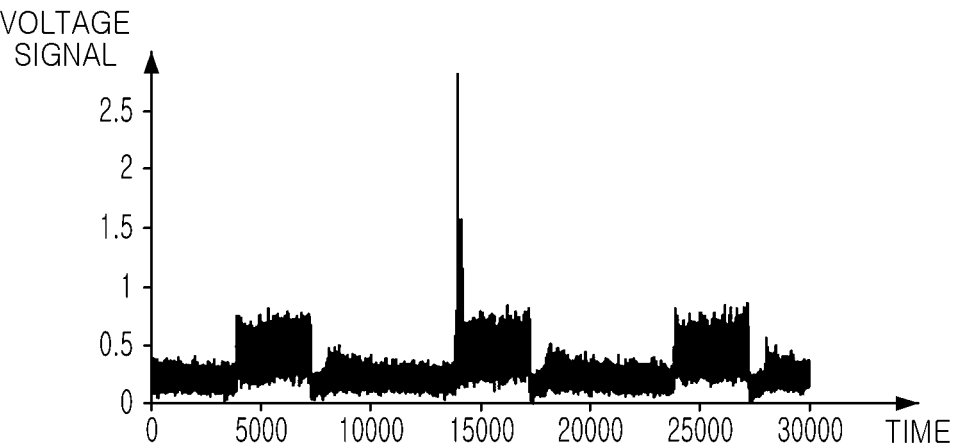

In the graphs illustrated in FIGS. 11A to 11C, the levels of the first to third voltage signals may vary in the abnormal range ΔAR greater than the normal range ΔNR at a specific time point. Accordingly, the processor receiving the first to third voltage signals may determine that an arc has occurred in the chamber at the corresponding time point. The processor may convert the received first to third voltage signals into raw data at a time when it is determined that an arc has occurred, and may form a spatial image in the chamber using the converted raw data, thereby determine a position of arc.

Figure 12A:
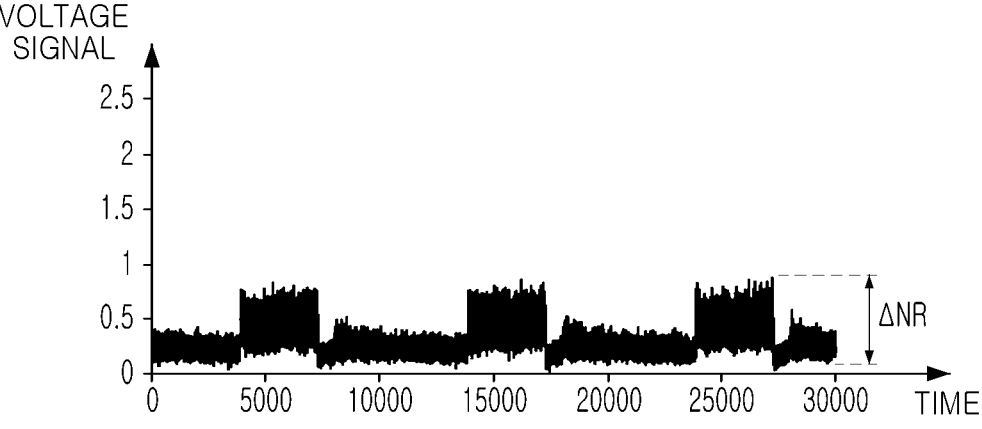
Figure 12B:
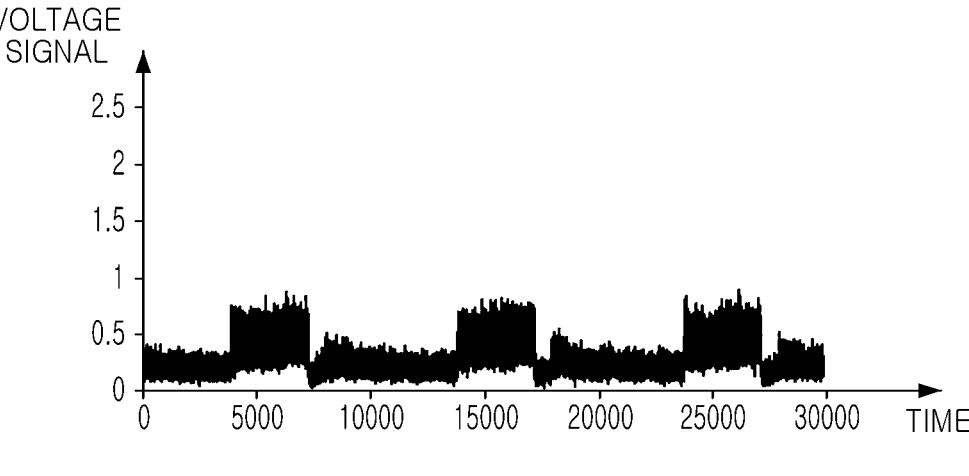
Figure 12C:
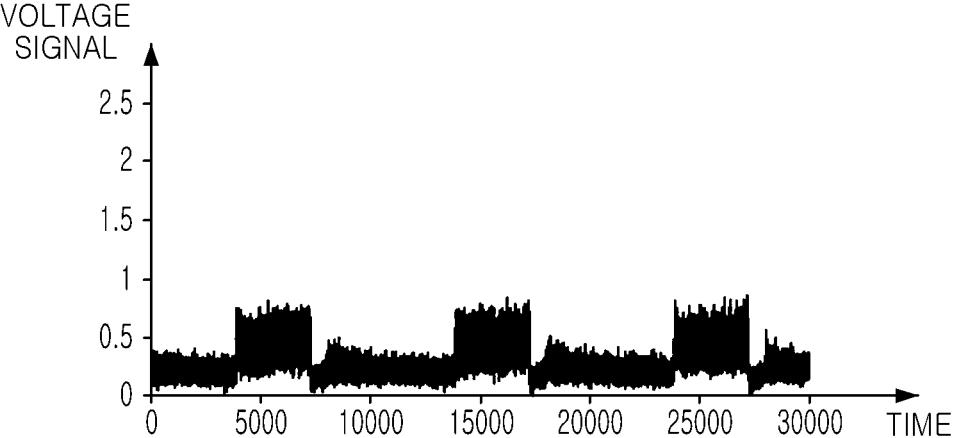

In the example embodiment described with reference to FIGS. 12A to 12C, each of the first to third voltage signals output by the first to third photodetectors may increase and decrease only within the normal range ΔNR while plasma is formed in the chamber and the semiconductor process is performed. Accordingly, the processor may determine that no arc has occurred in the chamber while the semiconductor process is performed.

Figure 13A:
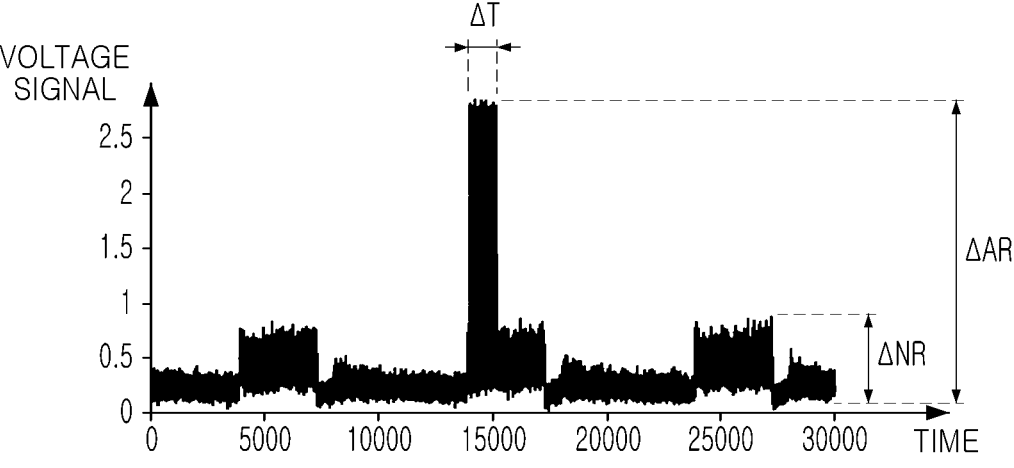
Figure 13B:
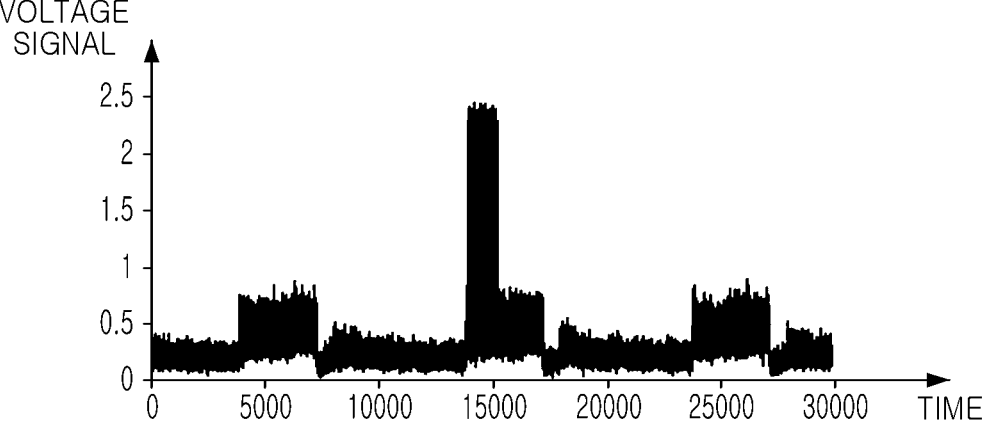
Figure 13C:
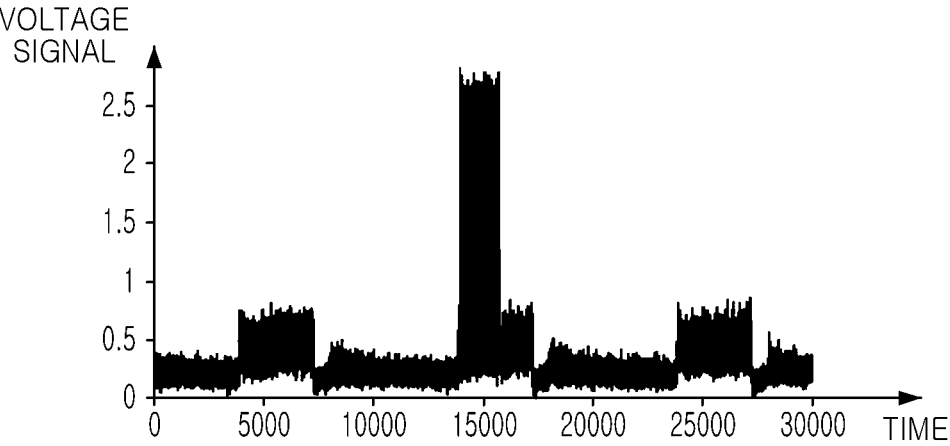

In the example embodiment described with reference to FIGS. 13A to 13C, each of the first to third voltage signals output by the first to third photodetectors may increase to a level beyond the normal range ΔNR within the predetermined time period ΔT while plasma is formed in the chamber and the semiconductor process is performed. However, as compared with the example embodiment described with reference to FIGS. 11A to 11C, the length of the time period ΔT in which each of the first to third voltage signals has a level beyond the normal range ΔNR may be relatively long.

When an unintentional arc occurs in the chamber, the first to third voltage signals may have levels beyond the normal range ΔNR for a relatively short period of time as illustrated in FIGS. 11A to 11C. Accordingly, as illustrated in FIGS. 13A to 13C, when the first to third voltage signals have levels beyond the normal range ΔNR for a relatively long period of time ΔT, the processor may be determined that an abnormal state other than arc occurred in the chamber.

Figure 14A:
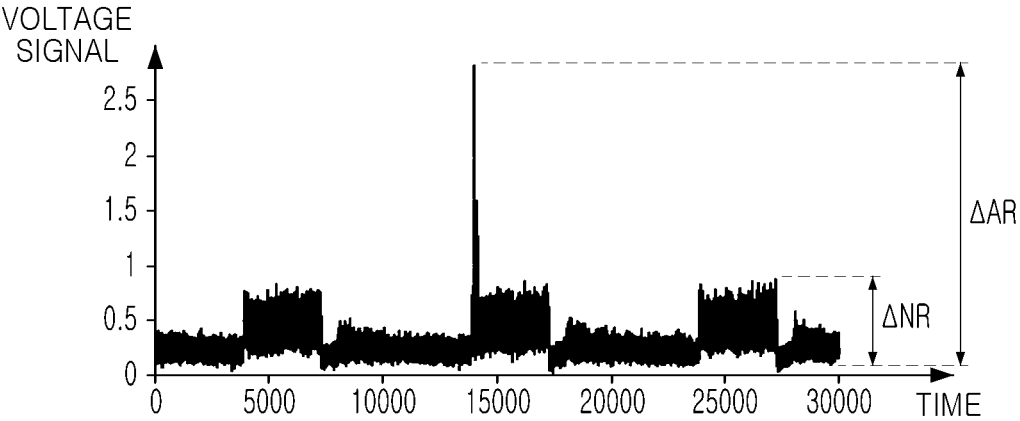
Figure 14B:
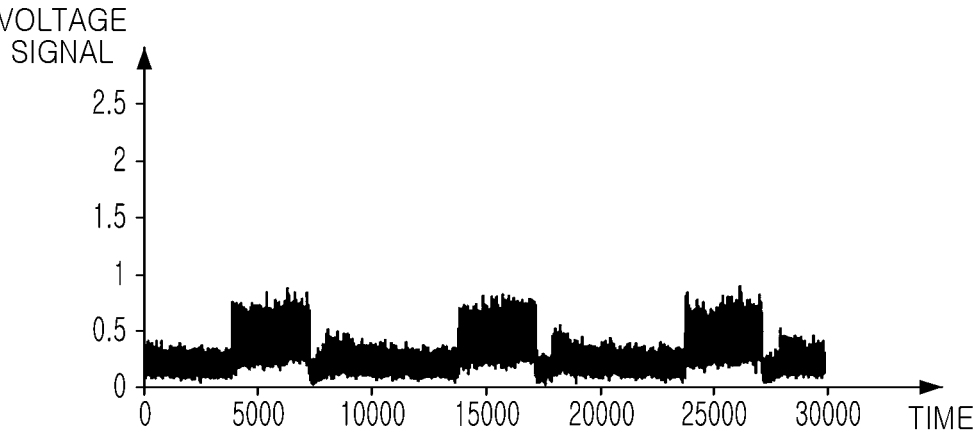
Figure 14C:
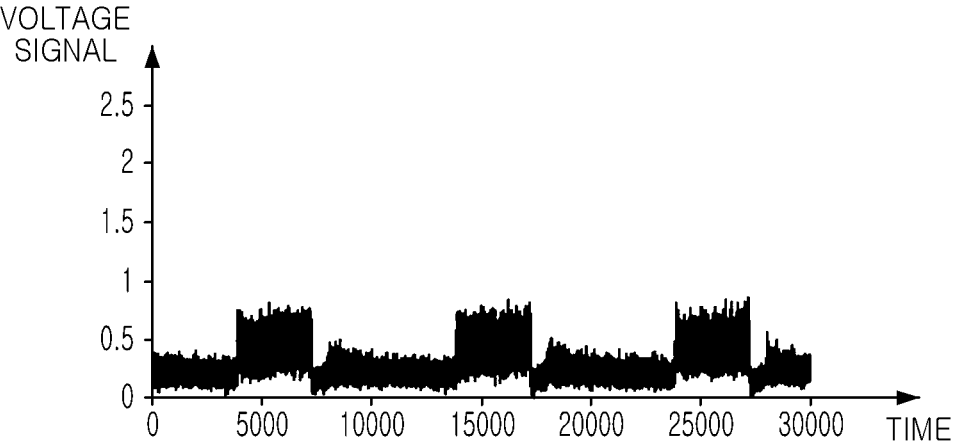

In the example embodiment described with reference to FIGS. 14A to 14C, only the first voltage signal may increase to a level beyond the normal range ΔNR at a specific time point while plasma is formed in the chamber and the semiconductor process is performed. Referring to FIGS. 14B and 14C, the second voltage signal and the third voltage signal may have levels belonging to the normal range ΔNR, and as illustrated in FIG. 14A, only the first voltage signal may increase to a level beyond the normal range ΔNR.

Even when only the voltage signal output by a portion of the photodetectors is beyond the normal range ΔNR as described above, the processor may determine that an arc has occurred in the chamber. The processor may convert the voltage signal at the corresponding time point into raw data, and may generate a spatial image based on the converted voltage signal, thereby determining the position in which the voltage is generated.

Figure 15:
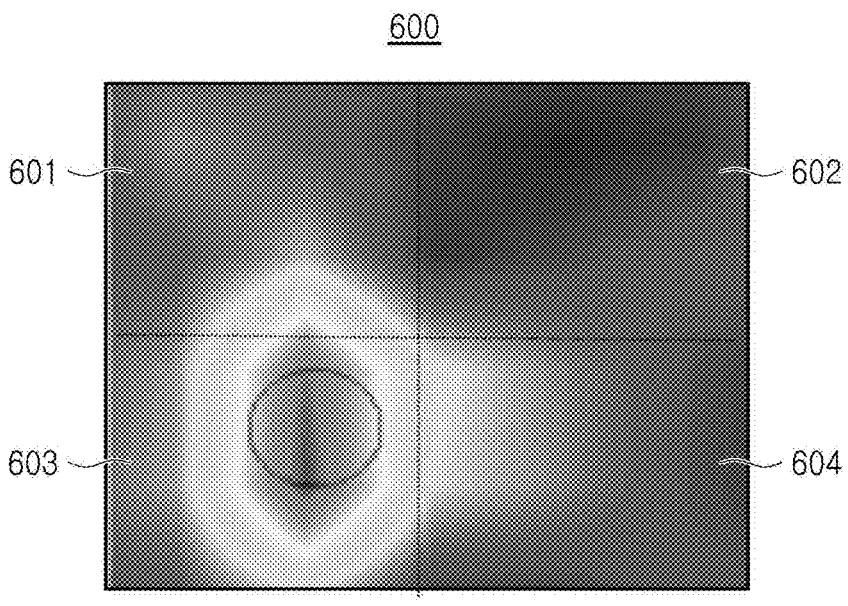
FIGS. 15 and 16 are diagrams illustrating operations of a semiconductor process device according to an example embodiment of the present disclosure.
Figure 16:
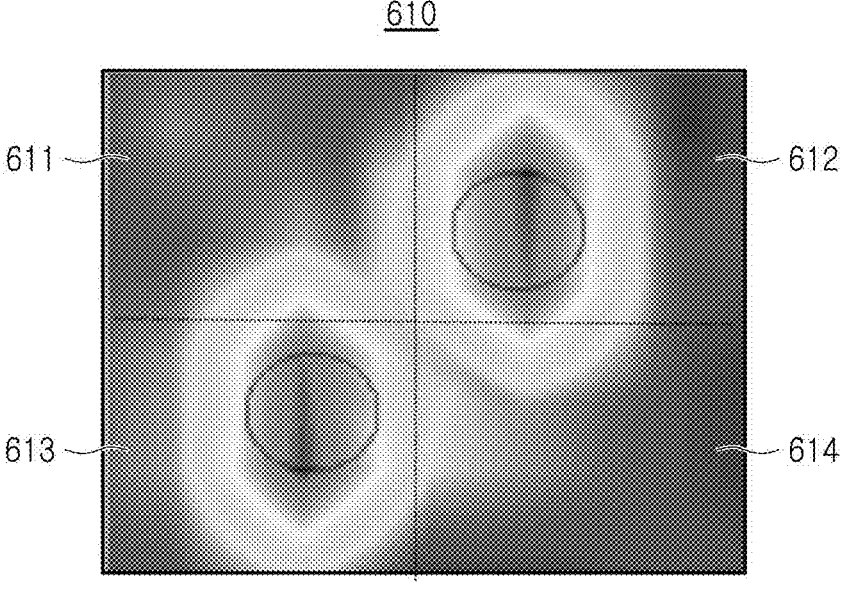

FIGS. 15 and 16 are diagrams illustrating operations of a semiconductor process device according to an example embodiment.

FIGS. 15 and 16 may be diagrams illustrating spatial images 600 and 610 generated by a processor in the semiconductor process device according to an example embodiment. In an example embodiment, the spatial images 600 and 610 described with reference to FIGS. 15 and 16 may be generated from one of the semiconductor process device 500, 500A, 500B, and 500C according to the example embodiments described with reference to FIGS. 7 to 10. Each of the spatial images 600 and 610 illustrated in FIGS. 15 and 16 may include first to fourth regions 601-604 and 611-614, and the first to fourth regions 601-604, 611-614 may correspond to first to fourth electrostatic chucks provided in the chamber.

The first spatial image 600 illustrated in FIG. 15 may be an image generated by the processor at a first time point. An arc may occur on the third electrostatic chuck in the chamber at the first time point. Accordingly, as illustrated in the first spatial image 600, peak data corresponding to the maximum voltage signal may appear in the third region 603 of the first to fourth regions 601 to 604. The processor may determine that an arc has occurred in a space adjacent to the third electrostatic chuck based on the first spatial image 600.

The second spatial image 610 illustrated in FIG. 16 may be an image generated by the processor at a second time point different from the first time point. An arc may occur simultaneously on the second electrostatic chuck and the third electrostatic chuck in the chamber at a second time point. Accordingly, as illustrated in the second spatial image 610, peak data corresponding to the maximum voltage signal may be generated in the second region 612 and the third region 613 of the first to fourth regions 611-614. The processor may determine that an arc has occurred in the space adjacent to the second electrostatic chuck and the third electrostatic chuck based on the first spatial image 610.

In an example embodiment described with reference to FIGS. 15 and 16, the processor may receive an electrical signal corresponding to an optical signal entering an optical system mounted in the chamber from a plurality of photodetectors, may monitor a level change of the electrical signal, and may specify the time at which an arc is estimated to have occurred. When the time at which an arc has occurred is specified, the processor may determine the position in which an arc occurred by generating a spatial image. For example, the processor may not continuously generate spatial images, and may generate spatial images only in a partial time period including the time point at which an arc is confirmed.

Accordingly, the processor may generate a plurality of spatial images indicating the state of the internal region of the chamber within a time period including the time at which an arc occurred, and may analyze a generation pattern of an arc based on the generated spatial images. To simultaneously generate a spatial image of a time point preceding the time point at which an arc occurred, the processor may store a portion of the continuously received electrical signals in internal and/or external memories. However, in example embodiments, the processor may generate a spatial image whenever an electrical signal is received from the photodetectors without determining a time point at which an arc occurred.

Figure 17:
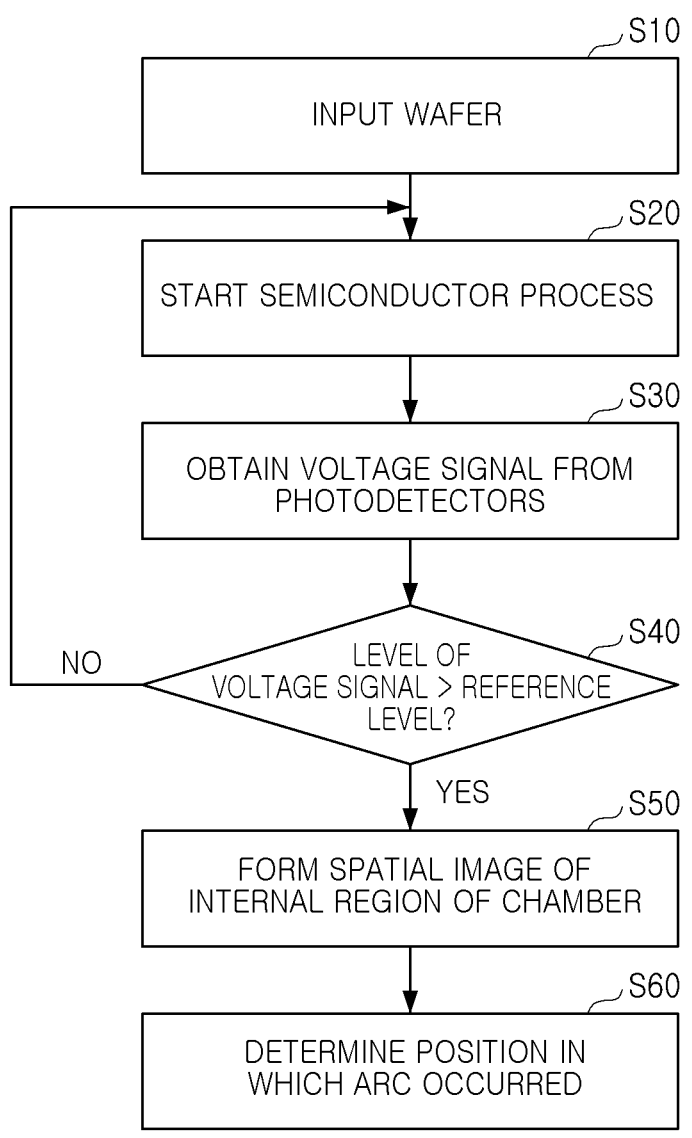
FIG. 17 is a flowchart illustrating operations of a semiconductor process device according to an example embodiment of the present disclosure.

FIG. 17 is a flowchart illustrating operations of a semiconductor process device according to an example embodiment.

Referring to FIG. 17, the operation of the semiconductor process device according to an example embodiment may start with inputting a wafer (S10). Wafers may be transported in containers such as FOUPs in a process line in which a semiconductor process device is disposed, and a wafer transfer robot may take the wafers out of the FOUP and may put the wafer into the semiconductor process device. The input wafer may be seated on an electrostatic chuck provided in a chamber of the semiconductor process device.

When the wafer is seated on the electrostatic chuck, RF power may be supplied to the bias electrodes in the chamber, a reaction gas may flow in and the semiconductor process may start (S20). While the semiconductor process is performed, plasma may be formed on the electrostatic chuck. When the semiconductor process is performed, an optical signal may be transmitted to the photodetectors through an optical system mounted on the window of the chamber, and the photodetectors may convert the optical signal into a voltage signal. A processor connected to the photodetectors may obtain a voltage signal (S30).

The processor may determine whether the level of the voltage signal increases above the reference level (S40). For example, the processor may not determine that it is abnormal that the level of the voltage signal fluctuates within a predetermined normal range in consideration of the environment in the chamber while the semiconductor process is performed. In other words, the reference level may be determined to be a level beyond the normal range.

The reference level may be determined to an absolute value greater than the normal range, or may be determined to a predetermined ratio to the normal range. For example, the reference level may be determined to an absolute value such as 1.5V or 2.0V. Alternatively, the reference level may be determined to a ratio to the normal range, such as 1.5 times or 2 times the maximum level of the voltage signal in the normal range.

When the level of the voltage signal does not increase above the reference level as a result of the determination in process S40, the processor may continue to receive the voltage signal from the photodetectors without any special operation. When the level of the voltage signal increases to more than the reference level as a result of the determination in process S40, the processor may obtain raw data by digitally converting the voltage signal, and may form a spatial image of the internal region of the chamber based on the data (S50).

For example, the spatial image may be configured as described above with reference to FIGS. 15 and 16. In the spatial image, peak data due to an arc may appear on a plane corresponding to the space in the chamber, and accordingly, the processor may determine the position in which an arc occurred based on the spatial image and may determine the wafer affected by the arc (S60).

According to the aforementioned example embodiments, the plurality of optical pickup units may receive an optical signal through an optical system mounted on a window of the chamber housing, and the optical signal may be converted into an electrical signal by the plurality of photodetectors. A processor connected to a plurality of photodetectors may determine whether an arc has occurred in the chamber housing based on changes in the level of the electrical signal, and may generate a spatial image of the internal region of the chamber housing by applying a tomography technique to the electrical signal, such that the position in which an arc occurred may be accurately determined. Accordingly, the wafer and the area greatly affected by the arc may be specified, and yield of the semiconductor process may improve.

While the example embodiments have been illustrated and described above, it will be apparent to those skilled in the art that modifications and variations could be made without departing from the scope of the present disclosure as defined by the appended claims.

What is claimed is:

1. A semiconductor process device, comprising:
   a chamber housing defining an internal region, and a plurality of electrostatic chucks within the internal region, and wherein the chamber housing comprises at least one window;
   a light collection unit comprising a first optical system and a second optical system mounted on the at least one window, a plurality of first optical pickup units connected to the first optical system, and a plurality of second optical pickup units connected to the second optical system;
   a sensor comprising a plurality of photodetectors that are configured to convert respective first optical signals transmitted by the plurality of first optical pickup units and respective second optical signals transmitted by the plurality of second optical pickup units into electrical signals; and a processor configured to generate a spatial image for the internal region of the chamber housing using the electrical signals output by the plurality of photodetectors, and determine a location at which an arc has occurred in the internal region of the chamber housing based on the spatial image, wherein the processor is configured to, when it is determined that the arc has occurred in the internal region of the chamber housing, process the electrical signals by a tomography method to generate the spatial image of the internal region of the chamber housing.

2. The semiconductor process device of claim 1, wherein the light collection unit further comprises a plurality of optical fibers connecting the plurality of photodetectors to the plurality of first optical pickup units and the plurality of second optical pickup units.

3. The semiconductor process device of claim 1, wherein the at least one window comprises first window and a second window at different locations on the chamber housing, and wherein the first optical system is mounted on the first window, and the second optical system is mounted on the second window.

4. The semiconductor process device of claim 3, wherein the first window is on a first surface of a first wall of the chamber housing and provides optical access through the first wall into the internal region of the chamber housing and the second window is on a second surface of a second wall of the chamber housing and provides optical access through the second wall into the internal region of the chamber housing, and wherein the first surface and the second surface are transverse to each other.

5. The semiconductor process device of claim 1, wherein each of the first optical system and the second optical system comprises a predetermined aperture value, and wherein the plurality of first optical pickup units collect the first optical signals through an aperture of the first optical system, and the plurality of second optical pickup units collect the second optical signals through an aperture of the second optical system.

6. The semiconductor process device of claim 1, wherein a first field of view of the first optical system comprises a sum of fields of view of the plurality of first optical pickup units, and a second field of view of the second optical system comprises a sum of fields of view of the plurality of second optical pickup units.

7. The semiconductor process device of claim 6, wherein the first field of view of the first optical system has a first angle and the second field of view of the second optical system has a second angle that is the same as the first angle.

8. The semiconductor process device of claim 6, wherein the first field of view is determined by a sum of a length of each of the plurality of first optical pickup units, and the second field of view is determined by a sum of a length of each of the plurality of second optical pickup units.

9. The semiconductor process device of claim 1, wherein, when an electrical signal output by at least one of the plurality of photodetectors increases above a predetermined reference level, the processor is configured to determine that the arc has occurred in the internal region of the chamber housing.

10. The semiconductor process device of claim 9, wherein, when the electrical signal output by the at least one of the plurality of photodetectors increases above the predetermined reference level and decreases below the predetermined reference level within a predetermined period of time, the processor is configured to determine that the arc has occurred in the internal region of the chamber housing.

11. The semiconductor process device of claim 9, wherein, when the electrical signal output by the at least one of the plurality of photodetectors increases by a predetermined ratio or more within a predetermined normal range, the processor is configured to determine that the arc has occurred in the internal region of the chamber housing.

12. A semiconductor process device, comprising:

a chamber housing comprising a first window on a first surface of a first wall of the chamber housing and a second window on a second surface of a second wall of the chamber housing, wherein the first surface is transverse to the second surface;

a plurality of first optical pickup units mounted on the first window and configured to detect a first optical signal from an internal region of the chamber housing through the first window;

a plurality of second optical pickup units mounted on the second window and configured to detect a second optical signal from the internal region of the chamber housing through the second window;

a sensor comprising a plurality of first photodetectors configured to output a first voltage signal in response to the first optical signal and a plurality of second photodetectors configured to output a second voltage signal in response to the second optical signal; and a processor configured to, when it is determined that an arc has occurred in the internal region of the chamber housing, generate a spatial image of the internal region of the chamber housing using the first voltage signal and the second voltage signal.

13. The semiconductor process device of claim 12, wherein the sensor and the processor are located remote from the chamber housing, and wherein the sensor is connected to the plurality of first optical pickup units and the plurality of second optical pickup units by a plurality of optical fibers.

14. The semiconductor process device of claim 12, wherein the plurality of first photodetectors and the plurality of second photodetectors are arranged in a matrix form in the sensor.

15. The semiconductor process device of claim 12, wherein a number of the plurality of first optical pickup units is equal to a number of the plurality of second optical pickup units.

16. The semiconductor process device of claim 12, wherein the processor comprises an analog-to-digital converter configured to convert the first voltage signal into first raw data and to convert the second voltage signal into second raw data, and a logic circuit configured to generate the spatial image using the first raw data and the second raw data.

17. The semiconductor process device of claim 12, wherein:

generating the spatial image of the internal region of the chamber housing comprises generating the spatial image of the internal region of the chamber housing by a tomography method.

18. A semiconductor process device, comprising:

a chamber housing comprising first and second walls;

a first window on a surface of the first wall, wherein the first window provides optical access through the first wall into an internal region of the chamber housing;

a second window on a surface of the second wall, wherein the second window provides optical access through the second wall into the internal region of the chamber housing;

a first optical system on the first window and having a first field of view;

a plurality of first optical pickup units configured to receive an optical signal from the internal region of the chamber housing through the first optical system;

a second optical system on the second window and having a second field of view;

a plurality of second optical pickup units configured to receive an optical signal from the internal region of the chamber housing through the second optical system; and a processor configured to, when it is determined that an arc has occurred in the internal region of the chamber housing, generate an image for the internal region of the chamber housing using the optical signal received by the plurality of first optical pickup units and the optical signal received by the plurality of second optical pickup units.

19. The semiconductor process device of claim 18, wherein a number of the plurality of first optical pickup units is equal to a number of the plurality of second optical pickup units, and wherein a first angle of the first field of view is the same as a second angle of the second field of view.

20. The semiconductor process device of claim 18, wherein the plurality of first optical pickup units are configured to receive a first optical signal for a first portion of the internal region of the chamber housing, wherein the plurality of first optical pickup units are configured to receive a second optical signal for a second portion of the internal region of the chamber housing that is different from the first portion of the internal region of the chamber housing, and wherein the first portion of the internal region and the second portion of the internal region partially overlap each other.

* * * * *